United States Patent
Kousai

(10) Patent No.: US 9,467,129 B2
(45) Date of Patent: Oct. 11, 2016

(54) DELAY APPARATUS

(71) Applicant: Kabushiki Kaisha Toshiba, Minato-Ku, Tokyo (JP)

(72) Inventor: Shouhei Kousai, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/645,075

(22) Filed: Mar. 11, 2015

(65) Prior Publication Data

US 2016/0056805 A1  Feb. 25, 2016

(30) Foreign Application Priority Data

Aug. 19, 2014  (JP) .................. 2014-166444

(51) Int. Cl.
*H03K 3/00* (2006.01)
*H03K 5/13* (2014.01)
*H03K 5/00* (2006.01)

(52) U.S. Cl.
CPC ..... *H03K 5/131* (2013.01); *H03K 2005/00065* (2013.01)

(58) Field of Classification Search
CPC ............... H03K 5/00; H03K 2005/00013; H03K 2005/0015; H03K 2005/00195; H03K 2005/00202; H03K 2005/00208; H03K 2005/00221; H03K 5/13; H03K 5/133; H03K 5/134

USPC ....... 327/261, 266, 269–272, 276, 278, 281, 327/285

See application file for complete search history.

(56) References Cited

U.S. PATENT DOCUMENTS

| | | |
|---|---|---|
| 3,913,021 A | 10/1975 | McCarthy et al. |
| 5,479,129 A | 12/1995 | Fernandez et al. |
| 6,657,473 B1 * | 12/2003 | Eto .......... H03K 5/133 327/261 |
| 8,907,710 B2 | 12/2014 | Xu et al. |
| 2013/0252559 A1 | 9/2013 | Deguchi et al. |

FOREIGN PATENT DOCUMENTS

JP  2013-198042 A  9/2013

* cited by examiner

*Primary Examiner* — Lincoln Donovan
*Assistant Examiner* — Diana J Cheng
(74) *Attorney, Agent, or Firm* — White & Case LLP

(57) ABSTRACT

The delay apparatus according to an embodiment includes a logic circuit that is connected between a first potential line and a first node and is driven by a driving current supplied from the first potential line. The delay apparatus includes a driving current adjusting circuit that is connected in a current path through which the driving current flows between the first node and a second potential line and adjusts the driving current of the logic circuit. The delay apparatus includes a supplying circuit that supplies a voltage or current to the first node. The delay apparatus includes a measuring circuit that measures the voltage or current at the first node. The delay apparatus includes a controlling circuit that controls the voltage or current output from the supplying circuit based on the measured voltage or measured current at the first node measured by the measuring circuit.

14 Claims, 6 Drawing Sheets

DELAY APPARATUS

CROSS-REFERENCE TO RELATED APPLICATION

This application is based upon and claims the benefit of priority from the prior Japanese Patent Application No. 2014-166444, filed on Aug. 19, 2014, the entire contents of which are incorporated herein by reference.

BACKGROUND

1. Field

Embodiments described herein relate generally to a delay apparatus.

2. Background Art

A conventional delay apparatus can adjust a delay time by changing a driving current of a delay element or changing the number of delay stages of a delay element. The delay element of such a conventional delay apparatus includes a phase locked loop (PLL) circuit or a digital locked loop (DLL) circuit and is not designed to separately set the driving current of an individual delay circuit.

DETAILED DESCRIPTION

A delay apparatus according to an embodiment includes a logic circuit that is connected between a first potential line and a first node and is driven by a driving current supplied from the first potential line. The delay apparatus includes a driving current adjusting circuit that is connected in a current path through which the driving current flows between the first node and a second potential line and adjusts the driving current of the logic circuit. The delay apparatus includes a supplying circuit that supplies a voltage or current to the first node. The delay apparatus includes a measuring circuit that measures the voltage or current at the first node. The delay apparatus includes a controlling circuit that controls the voltage or current output from the supplying circuit based on the measured voltage or measured current at the first node measured by the measuring circuit. The driving current adjusting circuit has a plurality of memory elements that are connected in series with each other and have a resistance that changes in response to the voltage or current output from the supplying circuit.

In the following, embodiments will be described with reference to the drawings.

First Embodiment

Figure 1:
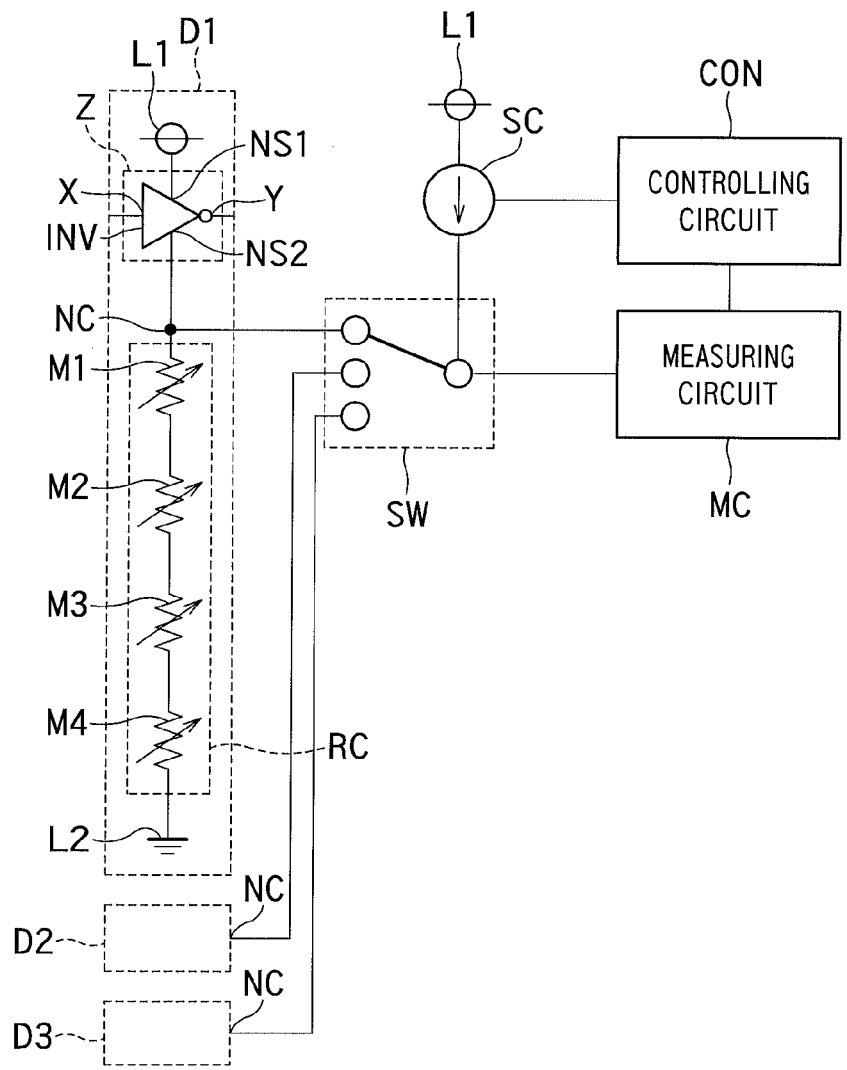
FIG. 1 is a circuit diagram showing an example of a configuration of a delay apparatus 100 according to a first embodiment.

FIG. 1 is a circuit diagram showing an example of a configuration of a delay apparatus 100 according to a first embodiment.

As shown in FIG. 1, the delay apparatus 100 includes a plurality of delay circuits "D1", "D2" and "D3", a supplying circuit "SC", a measuring circuit "MC", a controlling circuit "CON", and a switch circuit "SW".

As shown in FIG. 1, the delay circuit "D1" includes a logic circuit "Z" and a driving current adjusting circuit "RC", for example. The delay circuits "D2" and "D3" have the same configuration as the delay circuit "D1".

Although FIG. 1 shows an example in which the delay apparatus 100 includes three delay circuits, the delay apparatus 100 may include one delay circuit, two delay circuits or four or more delay circuits.

The logic circuit "Z" has an input "X" and an output "Y" and is connected between a first potential line "L1" and an adjusting node "NC". The logic circuit "Z" is driven by a driving current supplied from the first potential line "L1".

The logic circuit "Z" has a first power supply node "NS1" connected to the first potential line "L1" and a second power supply node "NS2" connected to the adjusting node "NC".

For example, the logic circuit "Z" receives the driving current from the first potential line "L1" via the first power supply node "NS1" and outputs the driving current to the adjusting node "NC" via the second power supply node "NS2".

For example, the operating speed of the logic circuit "Z" increases (that is, the delay time of the delay circuit "D1" increases) as the driving current increases.

In the example shown in FIG. 1, the first potential line "L1" is connected to a power supply, and the second potential line "L2" is connected to a ground.

However, the first potential line "L1" may be connected to the ground, and the second potential line "L2" may be connected to the power supply. In that case, the polarity of the driving current is reversed, compared with the driving current in the example shown in FIG. 1.

The driving current adjusting circuit "RC" is connected in a current path through which the driving current flows between the adjusting node "NC" and the second potential line "L2", and adjusts the driving current of the logic circuit "Z".

For example, as a resistance of the driving current adjusting circuit "RC" increases, the driving current of the delay circuit "D1" decreases. And as the driving current of the delay circuit "D1" decreases, the delay time of the delay circuit "D1" increases. In short, as the resistance of the driving current adjusting circuit "RC" increases, the delay time of the delay circuit "D1" increases.

On the other hand, as the resistance of the driving current adjusting circuit "RC" decreases, the driving current of the delay circuit "D1" increases. And as the driving current of the delay circuit "D1" increases, the delay time of the delay circuit "D1" decreases. In short, as the resistance of the driving current adjusting circuit "RC" decreases, the delay time of the delay circuit "D1" decreases.

As shown in FIG. 1, the driving current adjusting current "RC" has a plurality of two-terminal memory elements "M1", "M2", "M3" and "M4" having a resistance that changes in response to an adjusting signal connected in series with each other between the adjusting node "NC" and the second potential line "L2".

A threshold at which the resistance changes varies among the plurality of memory elements "M1", "M2", "M3" and "M4" due to the manufacturing process or the like. Therefore, the resistance of the driving current adjusting circuit "RC" can be changed stepwise by changing the magnitude of the adjusting signal stepwise.

The memory elements "M1", "M2", "M3" and "M4" are variable-resistance memories, such as a magnetoresistive random access memory (MRAM), an ion memory, a phase-change memory, or a resistance random access memory (ReRAM).

For example, if the memory elements are MRAMs, the resistance of the driving current adjusting circuit "RC" changes when an adjusting signal having a current equal to or higher than a threshold is applied.

For example, if the memory elements are ReRAMs, the resistance of the driving current adjusting circuit "RC" changes when an adjusting signal having a voltage equal to or higher than a threshold is applied.

Although FIG. 1 shows an example in which the driving current adjusting circuit "RC" has four memory elements, it is essential only that the driving current adjusting circuit "RC" has a plurality of (two or more) memory elements.

The switch circuit "SW" is connected between the adjusting node "NC" and an output of the supplying circuit "SC" and an input of the measuring circuit "MC" (measuring node). The switch circuit "SW" is controlled by the controlling circuit "CON".

The supplying circuit "SC" supplies an adjusting signal for a voltage or current that adjusts the resistance of the driving current adjusting circuit "RC" to the adjusting node "NC", or supplies a preset current or voltage to the adjusting node "NC". When the supplying circuit supplies a current or voltage to the adjusting node "NC", the switch circuit "SW" connects the output of the supplying circuit "SC" and the adjusting node "NC" to each other.

The value of the preset current output from the supplying circuit "SC" is smaller than the value of the current of the adjusting signal. That is, the value of the preset current is set so that the resistance of the memory elements "M1", "M2", "M3" and "M4" does not change when the preset current flows through the memory elements "M1", "M2", "M3" and "M4".

The measuring circuit "MC" measures the voltage at the adjusting node "NC" while the preset current is being supplied to the adjusting node "NC". When the measuring circuit "MC" measures the voltage at the adjusting node "NC", the switch circuit "SW" connects the input of the measuring circuit "MC" and the adjusting node "NC" to each other. Alternatively, the measuring circuit "MC" measures the current at the adjusting node "NC" while the preset voltage is being supplied to the adjusting node "NC". When the measuring circuit "MC" measures the current at the adjusting node "NC", the switch circuit "SW" connects the input of the measuring circuit "MC" and the adjusting node "NC" to each other.

Based on the voltage at the adjusting node "NC" measured by the measuring circuit "MC", the controlling circuit "CON" controls the adjusting signal output from the supplying circuit "SC". Alternatively, the controlling circuit "CON" may control the adjusting signal output from the supplying circuit "SC" based on the current at the adjusting node "NC" measured by the measuring circuit "MC".

For example, the controlling circuit "CON" controls the switch circuit "SW" to establish a connection between the adjusting node "NC" of one of the plurality of delay circuits "D1", "D2" and "D3" that is in charge of adjustment of the driving current and the supplying circuit "SC" and the measuring circuit "MC", and to block the connections between the adjusting nodes "NC" of the remaining delay circuits of the plurality of delay circuits "D1", "D2" and "D3" and the supplying circuit "SC" and the measuring circuit "MC".

In particular, the controlling circuit "CON" controls switching of the switch circuit "SW" based on the voltage at the adjusting node "NC" measured by the measuring circuit "MC".

For example, if the measured voltage has not reached a target voltage, the controlling circuit "CON" controls the switch circuit "SW" to establish the connection between the adjusting node "NC" and the supplying circuit "SC" and the measuring circuit "MC".

On the other hand, if the measured voltage has reached the target voltage, the controlling circuit "CON" controls the switch circuit "SW" to block the connection between the adjusting node "NC" and the supplying circuit "SC" and the measuring circuit "MC".

Figure 2:
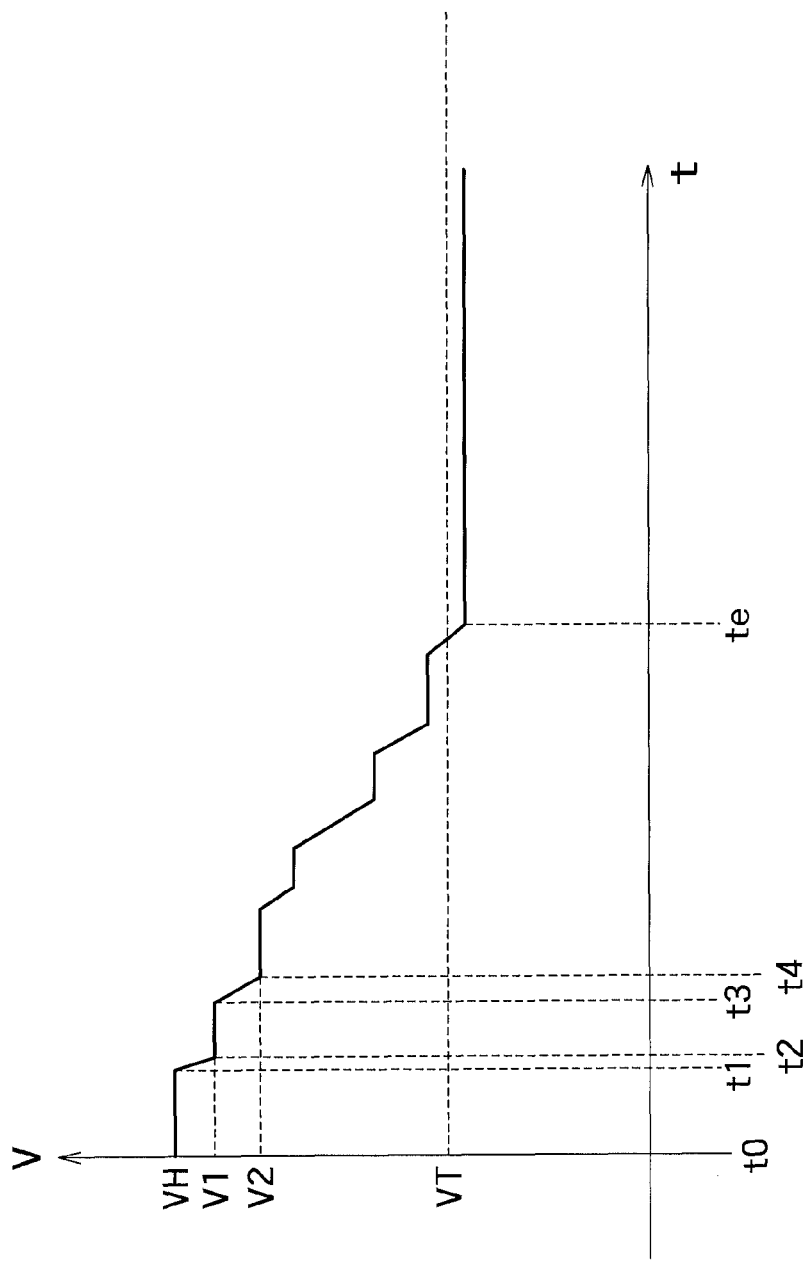
FIG. 2 is a waveform diagram showing an example of the way in which the measured voltage changes when an adjusting signal that increases stepwise is applied to the adjusting node "NC"

Next, an example of an operation of the delay apparatus 100 configured as described above will be described. FIG. 2 is a waveform diagram showing an example of the way in which the measured voltage changes when an adjusting signal that increases stepwise is applied to the adjusting node "NC".

First, in order to adjust the driving current of the delay circuit "D1", the controlling circuit "CON" controls the switch circuit "SW". In this process, the controlling circuit "CON" establishes the connection between the adjusting node "NC" of one delay circuit "D1" of the plurality of delay circuits "D1", "D2" and "D3" that is in charge of adjustment of the driving current and the supplying circuit "SC" and the measuring circuit "MC", and blocks the connections between the adjusting nodes "NC" of the remaining delay circuits "D2" and "D3" of the plurality of delay circuits "D1", "D2" and "D3" and the supplying circuit "SC" and the measuring circuit "MC".

At a time "t0", the resistance of the driving current adjusting circuit "RC" is set at a maximum value, for example. Therefore, the voltage at the adjusting node "NC" measured by the measuring circuit "MC" assumes a maximum voltage value "VH".

After that, the controlling circuit "CON" makes the supplying circuit "SC" supply an adjusting signal having a first value to the adjusting node "NC" (from a time "t1" to a time "t2").

In response to this, the resistance of any of the plurality of memory elements "M1", "M2", "M3" and "M4" changes (decreases). In other words, the resistance of the driving current adjusting circuit "RC" decreases.

The controlling circuit "CON" then obtains the voltage at the adjusting node "NC" measured by the measuring circuit "MC" while the supplying circuit "SC" is supplying the preset current to the adjusting node "NC". As described above, since the resistance of the driving current adjusting circuit "RC" has decreased, the measured voltage at the adjusting node "NC" assumes a voltage value "V1" lower than the maximum voltage value "VH" (from the time "t1" to the time "t2").

The resistance of the driving current adjusting circuit "RC" is the measured value divided by the measured current.

The controlling circuit "CON" then determines whether or not the measured voltage has reached a target voltage "VT". In this example, the voltage value "V1" has not reached the target voltage "VT" (the voltage value "V1" is higher than the target voltage "VT").

Since the measured voltage has not reached the target voltage, the controlling circuit "CON" controls the switch circuit "SW" to establish the connection between the adjusting node "NC" of the delay circuit "D1" and the supplying circuit "SC" and the measuring circuit "MC".

Since the measured voltage has not reached the target voltage, the controlling circuit "CON" makes the supplying circuit "SC" supply an adjusting signal having a second value greater than the first value to the adjusting node "NC" (from a time "t3" to a time "t4").

In response to this, the resistance of any of the plurality of memory elements "M1", "M2", "M3" and "M4" that has not changed yet changes (decreases). In other words, the resistance of the driving current adjusting circuit "RC" further decreases.

The controlling circuit "CON" then obtains the voltage at the adjusting node "NC" measured by the measuring circuit "MC" while the supplying circuit "SC" is supplying the preset current to the adjusting node "NC".

The controlling circuit "CON" then determines whether or not the measured voltage has reached the target voltage "VT". In this example, a voltage value "V2" has not reached the target voltage "VT" (the voltage value "V2" is higher than the target voltage "VT").

Since the measured voltage has not reached the target voltage, the controlling circuit "CON" controls the switch circuit "SW" to establish the connection between the adjusting node "NC" of the delay circuit "D1" and the supplying circuit "SC" and the measuring circuit "MC".

The controlling circuit "CON" then repeats the same controlling operation. As a result, the resistance of the driving current adjusting circuit "RC" further decreases.

When the measured voltage reaches the target voltage "VT", the controlling circuit "CON" controls the switch circuit "SW" to block the connection between the adjusting node "NC" and the delay circuit "D1" and the supplying circuit "SC" and the measuring circuit "MC".

By the operation described above, the resistance of the driving current adjusting circuit "RC" is adjusted to a value based on the target voltage, and the driving current of the delay circuit "D1" is adjusted to a predetermined value. That is, the delay time of the delay circuit "D1" is adjusted to a predetermined value.

In order to adjust the driving current of the delay circuit "D2", the controlling circuit "CON" then controls the switch circuit "SW" to establish the connection between the adjusting node "NC" of one delay circuit "D2" of the plurality of delay circuits "D1", "D2" and "D3" that is in charge of adjustment of the driving current and the supplying circuit "SC" and the measuring circuit "MC", and to block the connections between the adjusting nodes of the remaining delay circuits "D1" and "D3" of the plurality of delay circuits "D1", "D2" and "D3" and the supplying circuit "SC" and the measuring circuit "MC".

The same operation as the operation performed for the delay circuit "D1" described above is then performed for the delay circuits "D2" and "D3".

As described above, the value of the preset current is set to be smaller than the value of the current of the adjusting signal. Therefore, even if the preset current flows through the memory element "M1", "M2", "M3" or "M4", the resistance of the memory element does not change.

As described above, the driving current adjusting circuit "RC" has the plurality of two-terminal memory elements "M1", "M2", "M3" and "M4" having a resistance that changes in response to the adjusting signal connected in series with each other between the adjusting node "NC" and the second potential line "L2". Furthermore, the threshold at which the resistance changes varies among the plurality of memory elements "M1", "M2", "M3" and "M4" due to the manufacturing process or the like.

Therefore, by changing the magnitude of the adjusting signal stepwise in the vicinity of the write threshold (that is, by gradually increasing the intensity or pulse width of the pulse), the resistances of some memory elements can be stochastically rewritten, thereby changing the resistance of the driving current adjusting circuit "RC" stepwise.

As described above, with the delay apparatus according to the first embodiment, the driving current adjusting circuit that adjusts the driving current of the delay circuit (logic circuit) is composed of a plurality of memory elements having a small footprint, and the driving current of each logic circuit can be individually set by rewriting the resistances of the plurality of memory elements.

Second Embodiment

Figure 3:
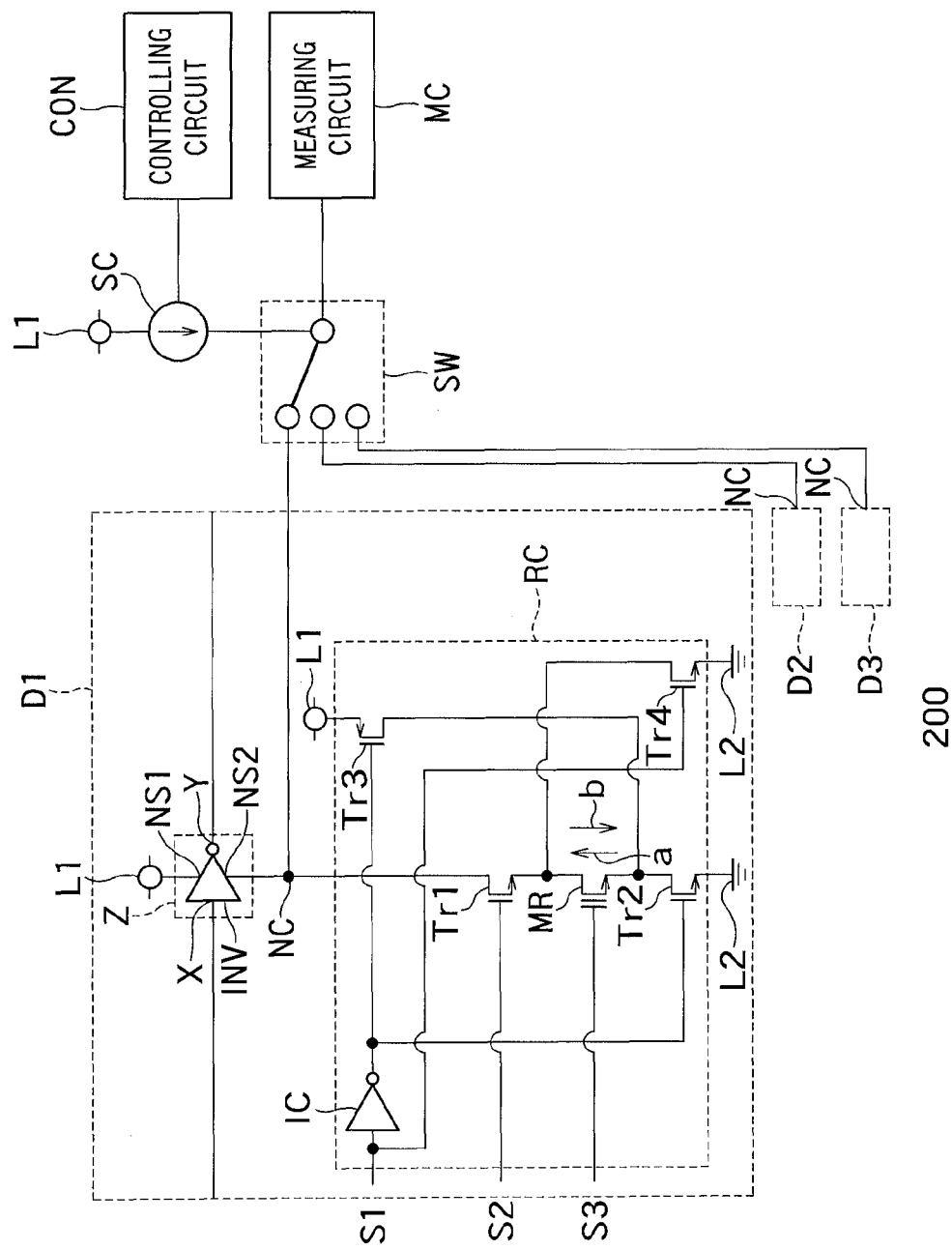
FIG. 3 is a circuit diagram showing an example of a configuration of a delay apparatus 200 according to a second embodiment.
Figure 4:
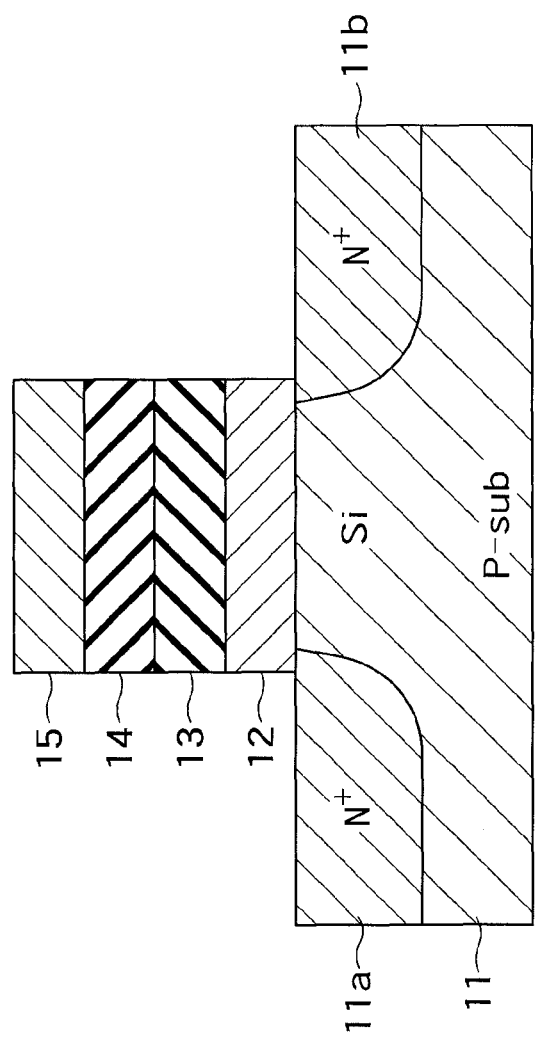
FIG. 4 is a cross-sectional view showing an example of a cross section of a resistive MOS transistor "MR" shown in FIG. 3.

FIG. 3 is a circuit diagram showing an example of a configuration of a delay apparatus 200 according to a second embodiment. FIG. 4 is a cross-sectional view showing an example of a cross section of a resistive MOS transistor "MR" shown in FIG. 3. In FIG. 3, the same reference numerals as those in FIG. 1 denote the same components as those in the first embodiment.

As shown in FIG. 3, as in the first embodiment, the delay apparatus 200 includes a plurality of delay circuits "D1", "D2" and "D3", a supplying circuit "SC", a measuring circuit "MC", a controlling circuit "CON", and a switch circuit "SW".

As in the first embodiment, the delay circuit "D1" includes a logic circuit "Z" and a driving current adjusting circuit "RC". The delay circuits "D2" and "D3" have the same configuration as the delay circuit "D1".

The delay apparatus 200 differs from the delay apparatus 100 according to the first embodiment in circuit configuration of the driving current adjusting circuit "RC".

As shown in FIG. 3, the driving current adjusting circuit "RC" includes a controlling inverter "IC", a first MOS transistor "Tr1", a second MOS transistor "Tr2", a third MOS transistor "Tr3", a fourth MOS transistor "Tr4", and a resistive MOS transistor "MR", which is a memory element, for example.

In the example shown in FIG. 3, the first, second and fourth MOS transistors "Tr1", "Tr2" and "Tr4" are nMOS transistors, and the third MOS transistor "Tr3" is a pMOS transistor, for example.

As shown in FIG. 3, the controlling inverter "IC" is connected to a gate of the fourth MOS transistor "Tr4" at an input thereof and to gates of the second and third MOS transistors "Tr2" and "Tr3" at an output thereof. The controlling inverter "IC" receives a first controlling signal "S1" at the input thereof. The controlling inverter "IC" outputs an inverted signal of the first controlling signal "S1".

The first MOS transistor "Tr1" is connected to an adjusting node "NC" at one end (drain) thereof and receives a second controlling signal "S2" at a gate thereof.

The resistive MOS transistor "MR" is connected to another end (source) of the first MOS transistor "Tr1" at one end (drain) thereof, and a controlling voltage "S3" is applied to a gate of the resistive MOS transistor "MR". The resistive MOS transistor "MR" is a MOS transistor having a silicon/ silicon oxide/silicon nitride/silicon oxide/poly silicon (SONOS) structure into which a hot carrier can be injected. In this example, the resistive MOS transistor "MR" is an nMOS transistor.

As shown in FIG. 4, the resistive MOS transistor "MR" having the SONOS structure includes a p-type silicon substrate 11, n-type diffusion regions 11a and 11b formed in the silicon substrate 11, a tunnel oxide film 12 disposed on a channel region formed between the n-type diffusion regions 11a and 11b, a silicon nitride film 13 disposed on the tunnel oxide film 12, a silicon oxide film 14 disposed on the silicon nitride film 13, and a polysilicon layer 15 disposed on the silicon oxide film 14.

One of the n-type diffusion regions 11a and 11b constitutes the drain, the other of the n-type diffusion regions 11a and 11b constitutes the source, and the polysilicon layer 15 constitutes the gate.

The tunnel oxide film 12 has a stacked structure of a first silicon oxide film, a silicon layer made from microcrystalline silicon grains that satisfy the Coulomb blockade condition, and a second silicon oxide film.

The silicon nitride film 13 is a floating gate that can store electric charges.

A threshold voltage of the resistive MOS transistor "MR" can be adjusted in response to the amount of electric charges stored in the silicon nitride film 13 by hot carrier injection. If electrons are stored in the silicon nitride film 13, when a positive voltage is applied to the gate, that is, the polysilicon layer 15, the stored electrons cancel the voltage, and it is difficult to form a channel. As a result, the threshold voltage of the resistive MOS transistor "MR" becomes higher. The threshold voltage can be raised by injecting more electrons.

As shown in FIG. 3, the second MOS transistor "Tr2" is connected to another end (source) of the resistive MOS transistor "MR" at one end (drain) thereof, to a second potential line "L2" at another end (source) thereof, and to the output of the controlling inverter "IC" at the gate thereof.

The second MOS transistor "Tr2" receives the inverted signal of the first controlling signal "S1" at the gate thereof. That is, the second MOS transistor "Tr2" is controlled in response to the first controlling signal "S1".

The third MOS transistor "Tr3" is connected to a first potential line "L1" at one end (source) thereof, to the another end (source) of the resistive MOS transistor "MR" at another end (drain) thereof, and to the output of the controlling inverter "IC" at the gate thereof.

The third MOS transistor "Tr3" receives the inverted signal of the first controlling signal "S1" at the gate thereof. That is, the third MOS transistor "Tr3" is controlled in response to the first controlling signal "S1".

The fourth MOS transistor "Tr4" is connected to the one end (drain) of the resistive MOS transistor "MR" at one end (drain) thereof, to the second potential line "L2" at another end (source) thereof, and to the input of the controlling inverter "IC" at the gate thereof.

The fourth MOS transistor "Tr4" receives the first controlling signal "S1" at the gate thereof. That is, the fourth MOS transistor "Tr4" is controlled in response to the first controlling signal "S1".

The remainder of the configuration of the delay apparatus 200 is the same as that of the delay apparatus 100 according to the first embodiment shown in FIG. 1.

Next, an example of an operation of the delay apparatus 200 configured as described above will be described.

First, an example of a write operation of rewriting (increasing) the resistance of the driving current adjusting circuit "RC" will be described.

In the write operation, the first controlling signal "S1" is set at a "High" level, the second controlling signal "S2" is set at a "Low" level, and the controlling voltage "S3" is set at a predetermined voltage value.

In the write operation, the driving current adjusting circuit "RC" turns off the second MOS transistor "Tr2" and turns on the third and fourth MOS transistors "Tr3" and "Tr4" in response to the first controlling signal "S1" (at the "High" level), and turns off the first MOS transistor "Tr1" in response to the second controlling signal "S2" (at the "Low" level).

As a result, a current "a" flows in the direction from the source to the drain of the resistive MOS transistor "MR".

Furthermore, in the write operation, in the driving current adjusting circuit "RC", the controlling voltage is applied to the gate of the resistive MOS transistor "MR" so that hot carrier injection occurs while the current "a" is flowing.

As a result, hot carries are injected to the resistive MOS transistor "MR" having the SONOS structure, and the threshold voltage of the resistive MOS transistor "MR" increases (the resistance of the driving current adjusting circuit "RC" increases).

Next, an example of a normal operation of passing the driving current through the driving current adjusting circuit "RC" will be described.

In the normal operation, the first controlling signal "S1" is set at the "Low" level, the second controlling signal "S2" is set at the "High" level, and the controlling voltage "S3" is set at the predetermined voltage value.

In the normal operation, the driving current adjusting circuit "RC" turns on the second MOS transistor "Tr2" and turns off the third and fourth MOS transistors "Tr3" and "Tr4" in response to the first controlling signal "S1" (at the "Low" level), and turns off the first MOS transistor "Tr1" in response to the second controlling signal "S2" (at the "High" level).

Furthermore, the controlling voltage is applied to the gate of the resistive MOS transistor "MR" to pass the driving current through the resistive MOS transistor "MR".

As a result, a current "b" (driving current) flows in the direction from the drain to the source of the resistive MOS transistor "MR". The level of the second controlling signal "S2" is set so that the first MOS transistor "Tr1" operates in a linear region.

As can be seen from the above description, the delay apparatus 200 according to the second embodiment shown in FIG. 3 differs from the delay apparatus 100 shown in FIG. 1 in the operation of changing the resistance of the driving current adjusting circuit "RC".

As in the first embodiment, the controlling circuit "CON" of the delay apparatus 200 obtains the measured voltage by controlling the switch circuit "SW", the supplying circuit "SC" and the measuring circuit "MC". The controlling circuit "CON" compares the measured voltage with the target voltage "VT" and repeats the operation of changing the resistance of the driving current adjusting circuit "RC" until the measured voltage reaches the target voltage.

The remainder of the operation of the delay apparatus 200 is the same as that of the delay apparatus 100 according to the first embodiment shown in FIG. 1.

As described above, with the delay apparatus according to the second embodiment, the driving current adjusting circuit that adjusts the driving current of the delay circuit (logic circuit) is composed of a plurality of memory elements having a small footprint, and the driving current of each logic circuit can be individually set by rewriting the resistances of the plurality of memory elements.

Third Embodiment

Figure 5:
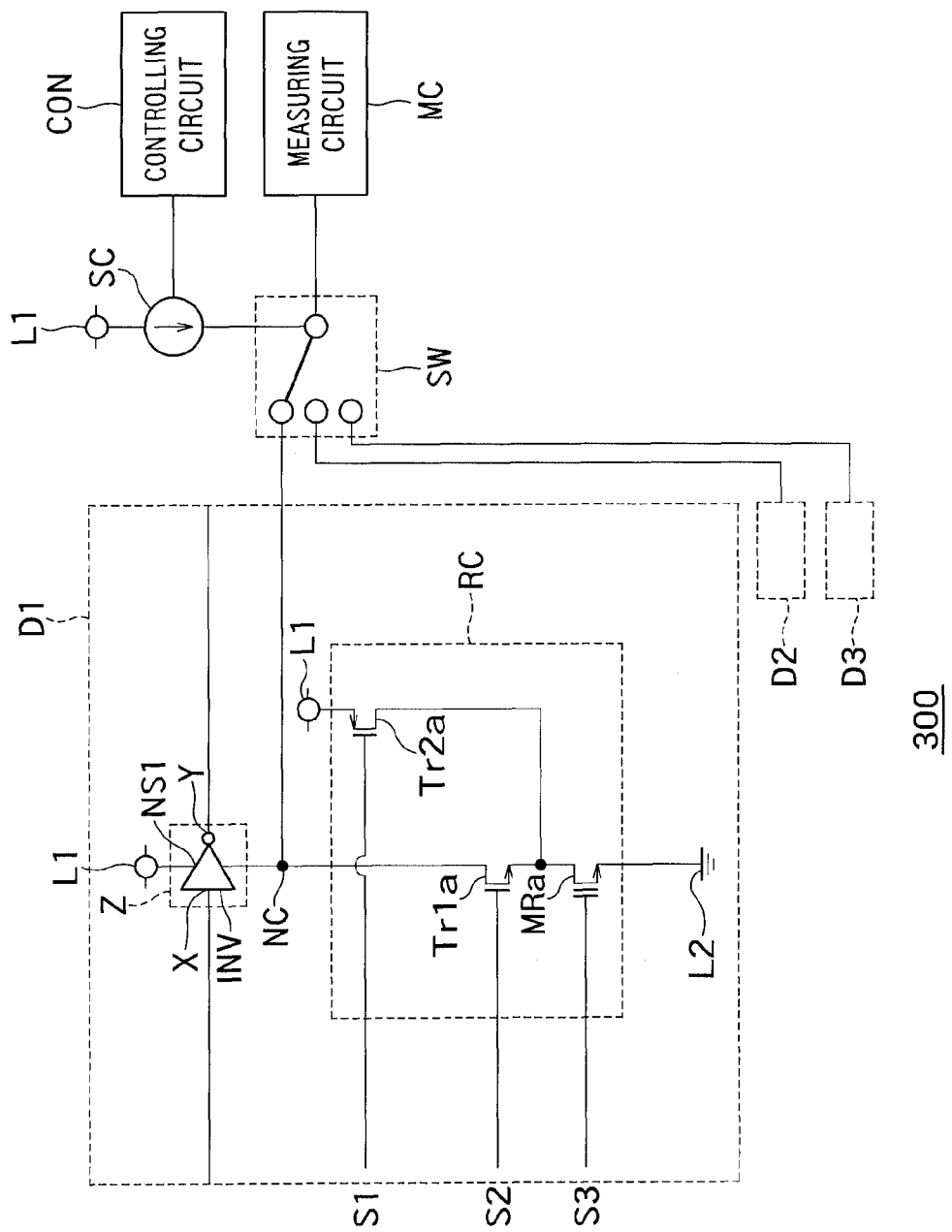
FIG. 5 is a circuit diagram showing an example of a configuration of a delay apparatus 300 according to a third embodiment.

FIG. 5 is a circuit diagram showing an example of a configuration of a delay apparatus 300 according to a third embodiment. In FIG. 5, the same reference numerals as those in FIG. 3 denote the same components as those in the second embodiment.

As shown in FIG. 5, as in the second embodiment, the delay apparatus 300 includes a plurality of delay circuits "D1", "D2" and "D3", a supplying circuit "SC", a measuring circuit "MC", a controlling circuit "CON", and a switch circuit "SW".

As in the second embodiment, the delay circuit "D1" includes a logic circuit "Z" and a driving current adjusting circuit "RC". The delay circuits "D2" and "D3" have the same configuration as the delay circuit "D1".

The delay apparatus 300 differs from the delay apparatus 200 according to the second embodiment in circuit configuration of the driving current adjusting circuit "RC".

As shown in FIG. 5, the driving current adjusting circuit "RC" includes a first MOS transistor "Tr1a", a second MOS transistor "Tr2a", and a resistive MOS transistor "MRa", which is a memory element, for example.

In the example shown in FIG. 5, the first MOS transistor "Tr1a" is an nMOS transistor, and the second MOS transistor "Tr2a" is a pMOS transistor, for example.

As shown in FIG. 5, the first MOS transistor "Tr1a" is connected to an adjusting node "NC" at one end (drain) thereof. The first MOS transistor "Tr1a" receives a second controlling signal "S2" at a gate thereof. That is, the first MOS transistor "Tr1a" is controlled in response to the second controlling signal "S2".

The resistive MOS transistor "MRa" is connected to another end (source) of the first MOS transistor "Tr1a" at one end (drain) thereof and to a second potential line "L2" at another end (source) thereof, and a controlling voltage (a third controlling signal) "S3" is applied to a gate of the resistive MOS transistor "MRa". The resistive MOS transistor "MRa" is a MOS transistor having a floating gate structure into which a hot carrier can be injected.

The second MOS transistor "Tr2a" is connected to a first potential line "L1" at one end (source) thereof and to the one end (drain) of the resistive MOS transistor "MRa" at another end (drain) thereof. The second MOS transistor "Tr2a" receives a first controlling signal "S1" at a gate thereof. That is, the second MOS transistor "Tr2a" is controlled in response to the first controlling signal "S1".

The remainder of the configuration of the delay apparatus 300 is the same as that of the delay apparatus 200 according to the second embodiment shown in FIG. 3.

Next, an example of an operation of the delay apparatus 300 configured as described above will be described.

First, an example of a write operation of rewriting (increasing) the resistance of the driving current adjusting circuit "RC" will be described.

In the write operation, the first controlling signal "S1" is set at a "Low" level, the second controlling signal "S2" is set at a "Low" level, and the controlling voltage "S3" is set at a predetermined voltage value.

In the write operation, the driving current adjusting circuit "RC" turns on the second MOS transistor "Tr2a" in response to the first controlling signal "S1" (at the "Low" level), and turns off the first MOS transistor "Tr1a" in response to the second controlling signal "S2" (at the "Low" level).

As a result, a write current from the first potential line "L1" flows in the direction from the drain to the source of the resistive MOS transistor "MRa" via the second MOS transistor "Tr2a". The write current is set to be greater than the driving current.

Furthermore, in the write operation, in the driving current adjusting circuit "RC", the controlling voltage is applied to the gate of the resistive MOS transistor "MRa" so that hot carrier injection occurs while the write current described above is flowing.

As a result, hot carries are injected to the resistive MOS transistor "MRa" having the floating gate structure, and the threshold voltage of the resistive MOS transistor "MRa" increases (the resistance of the driving current adjusting circuit "RC" increases).

Next, an example of a normal operation of passing the driving current through the driving current adjusting circuit "RC" will be described.

In the normal operation, the first controlling signal "S1" is set at the "High" level, the second controlling signal "S2" is set at the "High" level, and the controlling voltage "S3" is set at the predetermined voltage value.

In the normal operation, the driving current adjusting circuit "RC" turns off the second MOS transistor "Tr2a" in response to the first controlling signal "S1" (at the "High" level), and turns on the first MOS transistor "Tr1a" in response to the second controlling signal "S2" (at the "High" level).

Furthermore, the controlling voltage is applied to the gate of the resistive MOS transistor "MRa" to pass the driving current through the resistive MOS transistor "MRa".

As a result, the driving current flows through the resistive MOS transistor "MRa". The level of the second controlling signal "S2" is set so that the first MOS transistor "Tr1a" operates in a linear region.

The remainder of the operation of the delay apparatus 300 is the same as that of the delay apparatus 200 according to the second embodiment shown in FIG. 3.

As described above, with the delay apparatus according to the third embodiment, the driving current adjusting circuit that adjusts the driving current of the delay circuit (logic circuit) is composed of a plurality of memory elements having a small footprint, and the driving current of each logic circuit can be individually set by rewriting the resistances of the plurality of memory elements.

Fourth Embodiment

Figure 6:
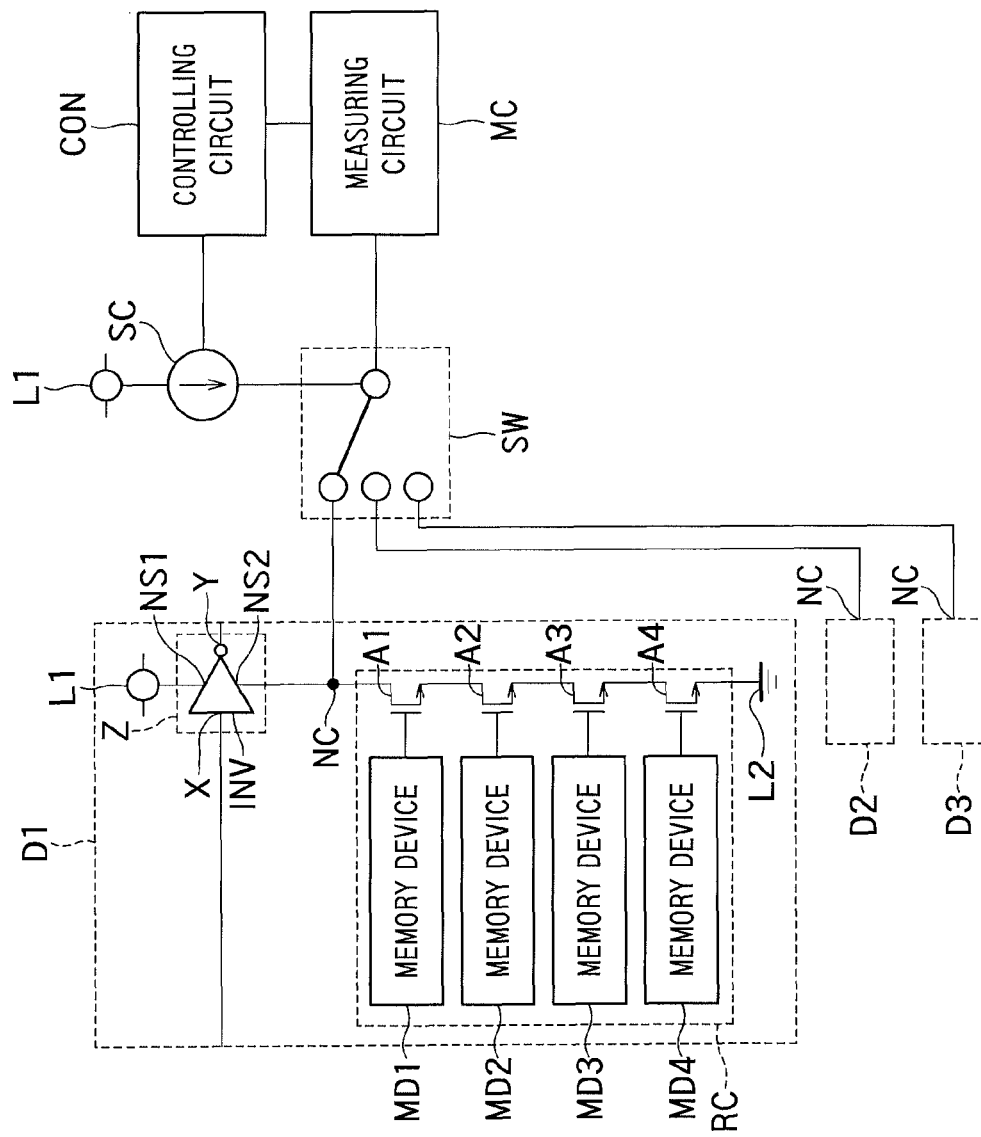
FIG. 6 is a circuit diagram showing an example of a configuration of a delay apparatus 400 according to a fourth embodiment.

FIG. 6 is a circuit diagram showing an example of a configuration of a delay apparatus 400 according to a fourth embodiment. In FIG. 6, the same reference numerals as those in FIG. 1 denote the same components as those in the first embodiment.

As shown in FIG. 6, as in the first embodiment, the delay apparatus 400 includes a plurality of delay circuits "D1", "D2" and "D3", a supplying circuit "SC", a measuring circuit "MC", a controlling circuit "CON", and a switch circuit "SW".

As in the first embodiment, the delay circuit "D1" includes a logic circuit "Z" and a driving current adjusting circuit "RC". The delay circuits "D2" and "D3" have the same configuration as the delay circuit "D1".

The delay apparatus 400 differs from the delay apparatus 100 according to the first embodiment in circuit configuration of the driving current adjusting circuit "RC".

As shown in FIG. 6, the driving current adjusting circuit "RC" includes a plurality of MOS transistors "A1", "A2", "A3" and "A4" and a plurality of memory devices "MD1", "MD2", "MD3" and "MD4", for example.

In the example shown in FIG. 6, the plurality of MOS transistors "A1", "A2", "A3" and "A4" are nMOS transistors, for example.

Although FIG. 6 shows an example in which the driving current adjusting circuit includes four MOS transistors, it is essential only that the driving current adjusting circuit includes a plurality of (two or more) MOS transistors.

The plurality of MOS transistors "A1", "A2", "A3" and "A4" are connected in series with each other between an adjusting node "NC" and a second potential line "L2".

The plurality of MOS transistors "A1", "A2", "A3" and "A4" have different sizes determined so that the closer to the adjusting node "NC" the MOS transistor, the larger the size of the MOS transistor is (the MOS transistor "A1" has the largest size, and the MOS transistor "A4" has the smallest size). In particular, the plurality of MOS transistors "A1", "A2", "A3" and "A4" have different gate widths determined so that the closer to the adjusting node "NC" the MOS transistor, the larger the gate width of the MOS transistor is (the MOS transistor "A1" has the largest gate width, and the MOS transistor "A4" has the smallest gate width).

Therefore, the plurality of MOS transistors "A1", "A2", "A3" and "A4" have different on-resistance values determined so that the closer to the adjusting node "NC" the MOS transistor, the smaller the on-resistance value of the MOS transistor is (the MOS transistor "A1" has the smallest on-resistance value, and the MOS transistor "A4" has the largest on-resistance value).

The plurality of memory devices "MD1", "MD2", "MD3" and "MD4" are provided in correspondence with the plurality of MOS transistors "A1", "A2", "A3" and "A4", and each supply a gate voltage based on the logic of data stored therein to the gate of the corresponding MOS transistor.

Therefore, the gate voltages supplied to the plurality of MOS transistors "A1", "A2", "A3" and "A4" are changed by changing the data stored in the plurality of memory devices "MD1", "MD2", "MD3" and "MD4".

The memory devices "MD1", "MD2", "MD3" and "MD4" each store 1-bit data. In this case, the gate voltage is controlled to assume one of two values (the "High" level and the "Low" level). That is, each of the MOS transistors "A1", "A2", "A3" and "A4" serves as a variable resistor whose resistance can be switched between two different on-resistances.

For example, the controlling circuit "CON" changes the data stored in the plurality of memory devices "MD1", "MD2", "MD3" and "MD4". However, another circuit component or the like may change the data stored in the plurality of memory devices "MD1", "MD2", "MD3" and "MD4".

The remainder of the configuration of the delay apparatus 400 is the same as that of the delay apparatus 100 according to the first embodiment shown in FIG. 1.

Next, an example of an operation of the delay apparatus 400 configured as described above will be described.

For example, in order to adjust the driving current of the delay circuit "D1", the controlling circuit "CON" controls the switch circuit "SW". In this process, the controlling circuit "CON" establishes the connection between the adjusting node "NC" of one delay circuit "D1" of the plurality of delay circuits "D1", "D2" and "D3" that is in charge of adjustment of the driving current and the supplying circuit "SC" and the measuring circuit "MC", and blocks the connections between the adjusting nodes "NC" of the remaining delay circuits "D2" and "D3" of the plurality of delay circuits "D1", "D2" and "D3" and the supplying circuit "SC" and the measuring circuit "MC".

The data stored in the memory devices "MD1" to "MD4" is then changed so that the resistance of the driving current adjusting circuit "RC" changes stepwise. As a result, gate voltages based on the logics of the data stored in the memory devices "MD1", "MD2", "MD3" and "MD4" are supplied from the memory devices "MD1", "MD2", "MD3" and "MD4" to the gates of the MOS transistors "A1", "A2", "A3" and "A4", respectively.

As a result, the value of the combined resistance of the on-resistances of the MOS transistors "A1", "A2", "A3" and "A4" changes stepwise.

The controlling circuit "CON" determines whether or not a measured voltage has reached a target voltage each time the resistance of the driving current adjusting circuit "RC" is changed.

When the measured voltage reaches a target voltage "VT", the controlling circuit "CON" controls the switch circuit "SW" to block the connection between the adjusting node "NC" of the delay circuit "D1" and the supplying circuit "SC" and the measuring circuit "MC".

By the operation described above, the resistance of the driving current adjusting circuit "RC" is adjusted to a value based on the target voltage, and the driving current of the delay circuit "D1" is adjusted to a predetermined value. That is, the delay time of the delay circuit "D1" is adjusted to a predetermined value.

As described above, the resistance of the driving current adjusting circuit "RC" can be changed stepwise by changing the data stored in the memory devices "MD1" to "MD4".

As described above, with the delay apparatus according to the fourth embodiment, the driving current adjusting circuit that adjusts the driving current of the delay circuit (logic circuit) is composed of a plurality of memory devices having a small footprint and a plurality of MOS transistors, and the driving current of each logic circuit can be individually set by changing the on-resistances of the plurality of MOS transistors.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A delay apparatus, comprising:
   a logic circuit that is connected between a first potential line and a first node and is driven by a driving current supplied from the first potential line;
   a driving current adjusting circuit that is connected in a current path through which the driving current flows between the first node and a second potential line and adjusts the driving current of the logic circuit;
   a supplying circuit that supplies a voltage or current to the first node;
   a measuring circuit that measures the voltage or current at the first node; and
   a controlling circuit that controls the voltage or current output from the supplying circuit based on the measured voltage or measured current at the first node measured by the measuring circuit,
   wherein the driving current adjusting circuit has:

a plurality of memory elements that have a resistance that are connected in series with each other and changes in response to the voltage or current output from the supplying circuit.

2. The delay apparatus according to claim 1, wherein the current or voltage output from the supplying circuit is any one of a voltage signal or current signal and a preset current or preset voltage.

3. The delay apparatus according to claim 2, wherein the controlling circuit
makes the supplying circuit supply the voltage signal or current signal having a first value to the first node,
then obtains the measured voltage at the first node measured by the measuring circuit while the supplying circuit is supplying the preset current to the first node, and
then determines whether or not the measured voltage reaches a target voltage.

4. The delay apparatus according to claim 3, wherein if the measured voltage does not reach the target voltage,
the controlling circuit makes the supplying circuit supply an adjusting current having a second value greater than the first value to the first node,
obtains the measured voltage at the first node measured by the measuring circuit while the supplying circuit is supplying the preset current having the second value to the first node, and
determines whether or not the measured voltage reaches the target voltage.

5. The delay apparatus according to claim 3, wherein if the measured voltage reaches the target voltage,
the controlling circuit stops operation of the supplying circuit and the measuring circuit.

6. The delay apparatus according to claim 5, further comprising:
a switch circuit that is connected between the first node and the supplying circuit and the measuring circuit and is controlled by the controlling circuit,
the controlling circuit
controls the switch circuit to establish a connection between the first node and the supplying circuit and the measuring circuit if the measured voltage does not reach the target voltage, and
controls the switch circuit to block connections between the first node and the supplying circuit and the measuring circuit if the measured voltage reaches the target voltage.

7. The delay apparatus according to claim 6, wherein the delay apparatus comprises a plurality of delay circuits each having the logic circuit and the driving current adjusting circuit, and
the controlling circuit controls the switch circuit to establish the connection between the first node of one of the plurality of delay circuits that is in charge of adjustment of the driving current and the supplying circuit and the measuring circuit and to block the connections between the first nodes of the remaining delay circuits of the plurality of delay circuits and the supplying circuit and the measuring circuit.

8. The delay apparatus according to claim 2, wherein the value of the preset current is set so that the resistance of the memory element does not change when the preset current flows through the memory element.

9. The delay apparatus according to claim 2, wherein the value of the preset current is smaller than the value of the current of the voltage signal or current signal.

10. The delay apparatus according to claim 1, wherein the logic circuit has:
a second node connected to the first potential line; and
a third node connected to the first node, and
the driving current supplied from the first potential line via the second node is output to the first node via the third node.

11. The delay apparatus according to claim 2, wherein the measuring circuit measures the voltage at the first node while the preset current is being supplied to the first node, or measures the current at the first node while the preset voltage is being supplied to the first node.

12. The delay apparatus according to claim 1, wherein the memory elements are MRAMs, ion memories, phase-change memories, or ReRAMs.

13. The delay apparatus according to claim 1, wherein the driving current decreases as the resistance of the driving current adjusting circuit increases, and
the driving current increases as the resistance of the driving current adjusting circuit decreases.

14. The delay apparatus according to claim 1, wherein a threshold at which the resistance changes varies among the plurality of memory elements.

* * * * *